(12) United States Patent
Wu et al.

(10) Patent No.: US 10,101,709 B2
(45) Date of Patent: Oct. 16, 2018

(54) TIME REGISTER

(71) Applicant: Huawei Technologies Co., Ltd., Shenzhen (CN)

(72) Inventors: Ying Wu, Delft (NL); Robert Bogdan Staszewski, Delft (NL); Yihong Mao, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/660,514

(22) Filed: Jul. 26, 2017

(65) Prior Publication Data

US 2017/0322520 A1 Nov. 9, 2017

Related U.S. Application Data

(63) Continuation of application No. PCT/EP2015/052187, filed on Feb. 3, 2015.

(51) Int. Cl.
| | |
|---|---|
| *H03M 1/50* | (2006.01) |
| *G04F 10/00* | (2006.01) |
| *H03K 5/135* | (2006.01) |
| *H03M 1/12* | (2006.01) |
| *H03M 1/00* | (2006.01) |
| *H03L 7/089* | (2006.01) |
| *H03L 7/081* | (2006.01) |
| *H03H 19/00* | (2006.01) |

(52) U.S. Cl.
CPC ........... *G04F 10/005* (2013.01); *H03K 5/135* (2013.01); *H03M 1/50* (2013.01); *H03H 19/004* (2013.01); *H03L 7/0814* (2013.01); *H03L 7/0891* (2013.01); *H03M 1/00* (2013.01); *H03M 1/12* (2013.01); *H03M 1/1225* (2013.01); *H03M 2201/4233* (2013.01)

(58) Field of Classification Search
CPC .. H03M 2201/4233; H03M 1/12; H03M 1/00; H03M 1/1225; H03L 7/0891; H03L 7/0814; H03H 19/004
USPC ........ 341/166, 118, 155, 156, 141; 327/158, 327/156, 337, 142
See application file for complete search history.

(56) References Cited

U.S. PATENT DOCUMENTS

| | | |
|---|---|---|
| 2012/0056769 A1 | 3/2012 | Wang et al. |
| 2012/0212268 A1* | 8/2012 | Kim .......................... H03L 7/07 327/158 |
| 2014/0086275 A1 | 3/2014 | Kim et al. |

OTHER PUBLICATIONS

Chen et al., "A CMOS Pulse-Shrinking Delay Element for Time Interval Measurement," IEEE Transactions on Circuits and Systems—II: Analog and Digital Signal Processing, vol. 47, No. 9, pp. 954-958, Institute of Electrical and Electronic Engineers, New York, New York (Sep. 2000).

(Continued)

*Primary Examiner* — Joseph Lauture
(74) *Attorney, Agent, or Firm* — Leydig, Voit & Mayer, Ltd.

(57) ABSTRACT

A time register includes: a pair of inputs coupled to a pair of input clocks; a pair of tri-state inverters for producing a pair of level signals; and a pair of outputs coupled to the level signals for producing a pair of output clocks, wherein the tri-state inverters are responsive to a pair of state signals and the pair of input clocks for holding or discharging the level signals.

14 Claims, 5 Drawing Sheets

(56) References Cited

OTHER PUBLICATIONS

Henzler et al., "90nm 4.7ps-Resolution 0.7-LSB Single-Shot Precision and 19pJ-per-Shot Local Passive Interpolation Time-to-Digital Converter with On-Chip Characterization," 2008 IEEE International Solid-State Circuits Conference, San Francisco, California, Institute of Electrical and Electronic Engineers, New York, New York (Feb. 3-7, 2008).

Iizuka et al., "A 580 fs-Resolution Time-to-Digital Converter Utilizing Differential Pulse-Shrinking Buffer Ring in 0.18μm CMOS Technology," IEICE Transactions on Electronics, vol. E95-C, No. 4, pp. 661-667 (Apr. 2012).

Kim et al., "All-Digital Phased-Locked Loop with Local Passive Interpolation Time-to-Digital Converter Based on Tristate Inverter," 2012 IEEE 55th International Midwest Symposium on Circuits and Systems (MWSCAS), Boise, Idaho, pp. 326-329, Institute of Electrical and Electronic Engineers, New York, New York (Aug. 5-8, 2012).

Rahkonen et al., "The Use of Stabilized CMOS Delay Lines for the Digitization of Short Time Intervals," IEEE Journal of Solid-State Circuits, vol. 28, No. 8, pp. 887-894 (Aug. 1993).

\* cited by examiner

TIME REGISTER

CROSS-REFERENCE TO RELATED APPLICATIONS

This application is a continuation of International Application No. PCT/EP2015/052187, filed on Feb. 3, 2015, the disclosure of which is hereby incorporated by reference in its entirety.

TECHNICAL FIELD

The present disclosure relates to a time register for application within a time-to-digital converter. In particular, the disclosure relates to a time register for propagating a time difference between an input signal and a state signal to a voltage level.

BACKGROUND

In general, a time-to-digital converter (TDC) is a device for recognizing events and providing a digital representation of the time they occurred. Time-to-digital converters or also called time digitizers are commonly used to measure a time interval and convert it into a digital output. TDCs are used in many different applications, where the time interval between two signal pulses shall be determined. Measurement is started and stopped, when either the rising or the falling edge of a signal pulse crosses a predefined threshold.

A lot of different types of TDCs currently exist. A Vernier TDC uses two delay lines, with respective inverter delay of t1 and t2. The effective time resolution is given by the delay difference t1−t2 (assuming t1>t2). Since time resolution is determined by a very small delay difference, a very large number of inverter stages is required to cover a large detection range which leads delay mismatch and meanwhile increases power consumption. A pulse-shrinking TDC that utilizes the difference between the rise time and the fall time of e.g., an inverter, is severely affected by process-voltage-temperature (PVT) variations. A time-amplifying TDC amplifies the time residue from a coarse TDC, which is then resolved in a fine TDC, in the same fashion as a two-step A/D converter, with the same attending linearity issue (critically dependent on PVT variations). A passive phase-interpolating TDC uses passive devices to achieve a sub-gate-delay, but its precision is limited by parasitic capacitances on the output nodes between interpolating resistors. A gated-ring oscillator TDC (GRO TDC) has the noise-shaping characteristic. The quantization noise is shaped in frequency as in a first-order $\Delta\Sigma$ modulator, i.e., it is largely pushed towards higher frequencies. Since the GRO TDC operates in high frequency, i.e, several Giga Hz the power consumption is very high and the $1^{st}$ order noise-shaping limits its bandwidth.

There is a need to improve the accuracy of time to digital converters. In particular it is required to improve the time-to-digital converter (TDC) resolution to about 1 ps, which is an order-of-magnitude better than that provided by the delay of an inverter delay in a given process technology. This kind of TDC resolution is extremely challenging, but nowadays needed, in low-power mobile applications, such as all-digital PLL (ADPLL)-based cellular phones.

SUMMARY

It is the object of the invention to provide a concept for improving the time-to-digital converter accuracy, in particular to improve the time to digital converter resolution by an order of magnitude compared to existing solutions.

This object is achieved by the features of the independent claims. Further implementation forms are apparent from the dependent claims, the description and the figures.

The basic concept described in this disclosure is the introduction of a time register or time-domain registered adder/subtractor for application within a time-to-digital converter. The time-domain registered adder/subtractor is for realizing the addition, subtraction and register functionality in time domain. An error-feedback TDC based on it achieves $1^{st}$ order noise-shaping. This TDC is then replicated to increase the noise shaping order to 3rd, which consists of a time interleaved time-domain adder/substractor register, quantizer and digital-to-time converter (DTC). With all the above, the time-domain noise-shaping characteristic is realized.

In order to describe the invention in detail, the following terms, abbreviations and notations will be used:
TDC: time-to-digital converter
DTC: digital-to-time converter
PLL: phase locked loop
ADPLL: all-digital PLL
PVT: process-voltage-temperature
GRO: gated ring oscillator
ADC: Analog-to-Digital Converter
DAC: Digital-to-Analog Converter In the following, devices and methods using tri-state inverters or tri-state logic circuits are described. A tri-state logic circuit, also referred to as three-state or 3-state logic circuit is an electronic circuit that allows an output port to assume a high impedance state in addition to the 0 and 1 logic levels, effectively removing the output from the circuit. This allows multiple circuits to share the same output line or lines. Three-state outputs are implemented in many registers, bus drivers, flip-flops and integrated circuits. Tri-state logic circuits may be controlled by an active-low input referred to as OE (Output Enable) which dictates whether the outputs should be held in a high-impedance state or drive their respective loads (to either 0- or 1-level). The tri-state logic circuit may be implemented by a tri-state inverter. The tri-state inverter functions as a kind of switch. It may include an input terminal, an output terminal and a control terminal. When the control signal C at control terminal is high the output Y is the inverted input signal X Otherwise, when C is low, the output is disconnected, i.e., the so-called high-Z state, which adds to 1 and 0 a third state Z.

According to a first aspect, the invention relates to a time register comprising: a pair of inputs coupled to a pair of input clocks; a pair of tri-state inverters for producing a pair of level signals; and a pair of outputs coupled to the level signals for producing a pair of output clocks, wherein the tri-state inverters are responsive to a pair of state signals and the pair of inputs for holding or discharging the level signals.

When applying such time register within a time-to-digital converter (TDC), the accuracy of the time-to-digital converter can be significantly improved, in particular to about 1-2 ps, that is, improved by an order of magnitude compared to existing solutions.

In a first possible implementation form of the time register according to the first aspect, the tri-state inverters are responsive to the state signals and the inputs for propagating a time difference of a pair of time differences between the respective input and the respective state signal to a voltage difference between the level signals.

By utilizing tri-state inverters for processing the state signals and the inputs, the time difference can be accurately propagated to the voltage difference.

In a second possible implementation form of the time register according to the first implementation form of the first aspect, the voltage difference between the level signals is proportional to the time difference of the pair of time differences.

Such a time register provides the advantage of proportional transition of the time difference into the voltage difference and therefore improves the accuracy of the time register and hence the accuracy of a TDC applying such time register.

In a third possible implementation form of the time register according to the first aspect as such or according to any of the preceding implementation forms of the first aspect, the time register comprises a pair of capacitances for capacitive loading the tri-state inverters.

Such capacitances can be easily and effectively implemented in hardware, e.g. in an integrated circuit on a chip.

In a fourth possible implementation form of the time register according to the first aspect as such or according to any of the preceding implementation forms of the first aspect, the time register comprises inverters or buffers connected to the tri-state inverters.

By connecting inverters or buffers to the tri-state inverters, the result of the tri-state inverters can be efficiently buffered and the tri-state inverters are ready for the next processing step.

In a fifth possible implementation form of the time register according to the first aspect as such or according to any of the preceding implementation forms of the first aspect, the time register comprises a charging source for precharging the level signal if the input is low.

By using such a charging source the level signal can be easily generated when the input signal is low.

In a sixth possible implementation form of the time register according to the first aspect as such or according to any of the preceding implementation forms of the first aspect, the time register comprises a logic circuitry for holding the level signal if the input is high and the state signal is low.

Such a logic circuitry can easily be implemented.

In a seventh possible implementation form of the time register according to the sixth implementation form of the first aspect, the logic circuitry is configured to discharge the level signal if the input signal is high and the state signal is high.

By using that logic circuitry different signal states of the level signal can be driven.

In an eighth possible implementation form of the time register according to the sixth or the seventh implementation forms of the first aspect, the logic circuitry is configured to drive the state signal responsive to a hold signal and an awake signal.

By using such logic circuitry a hold signal and an awake signal can control the state of the time register, i.e. the time register can be easily controlled.

In a ninth possible implementation form of the time register according to the eighth implementation form of the first aspect, the logic circuitry is further configured to drive the state signal responsive to a preset signal such that the state signal is high if the preset signal is high.

By using such logic circuitry a preset signal can be used to drive the state signal, hence providing an easy implementation of the time register.

In a tenth possible implementation form of the time register according to the ninth implementation form of the first aspect, the logic circuitry is configured to drive the state signal such that the state signal toggles upon a rising edge of either the hold signal or the awake signal.

By using such logic circuitry the time register is sensitive with respect to rising signal edges, hence resulting in improved accuracy of the time register.

In an eleventh possible implementation form of the time register according to any of the eighth to the tenth implementation forms of the first aspect, the awake signal is a sampling clock and the hold signal is a quantization error signal.

When the awake signal is a sampling clock and the hold signal is a quantization error signal, the hold signal of the time register can be applied in a feedback path of a TDC while the awake signal can be used to clock the TDC, hence providing a high precision TDC.

In a twelfth possible implementation form of the time register according to the eleventh implementation form of the first aspect, each of the pair of outputs is produced on the sampling clock, the output is a function of a time difference between a corresponding input clock and the quantization error signal.

Such a time register has the advantage that the output can accurately represent the time difference between the input clock and the quantization error signal and thus, the time register can be applied as a high-precision delay unit in a time-to-digital converter.

According to a second aspect, the invention relates to a time register comprising a first and a second circuit, each of the circuits comprising: a tri-state inverter coupled between a capacitive loaded first node and an output node, the tri-state inverter comprising: a PMOS transistor coupled between a battery voltage and the first node; and a first NMOS transistor and a second NMOS transistor coupled in series between the first node and a reference voltage, wherein a control terminal of the PMOS transistor and a control terminal of the first NMOS transistor are driven by an input signal and a control terminal of the second NMOS transistor is driven by a state signal, and wherein the tri-state inverter is configured to propagate a time difference between the input signal and the state signal to a voltage level at the first node.

When applying such time register within a time-to-digital converter (TDC), the accuracy of the time-to-digital converter can be significantly improved, in particular to about 1-2 ps, that is, improved by an order of magnitude compared to existing solutions.

In a first possible implementation form of the time register according to the second aspect, the tri-state inverters of the first and the second circuit are responsive to the state signals and the input signals for propagating a difference of the time difference of the first circuit and the time difference of the second circuit to a difference of the voltage levels at the first node of the first and second circuit.

Using such time register in a TDC has the advantage that the time-to-digital converter accuracy can be improved. In particular, a time to digital converter resolution of about 1-2 ps can be obtained.

According to a third aspect, the invention relates to a method for time buffering, the method comprising: receiving a pair of input clocks; producing a pair of level signals by a pair of tri-state inverters; producing a pair of output clocks based on the pair of level signals; and holding or discharging the level signals responsive to a pair of state signals and the pair of input clocks.

When applying such time buffering within a time-to-digital conversion, the accuracy of the time-to-digital conversion can be significantly improved, in particular to about 1-2 ps, that is, improved by an order of magnitude compared to existing solutions.

In a first possible implementation form of the method according to the third aspect, the pair of level signals is produced responsive to the state signals and the inputs clocks for propagating a time difference of a pair of time differences between the respective input clock and the respective state signal to a voltage difference between the level signals.

By utilizing such production of level signals responsive to the state signals and the input clocks, the time difference can be accurately propagated to the voltage difference.

In a second possible implementation form of the method according to the third implementation form of the first aspect, the voltage difference between the level signals is proportional to the time difference of the pair of time differences.

Such a time buffering provides the advantage of proportional transition of the time difference into the voltage difference and therefore improves the accuracy of the time buffering and hence the accuracy of a time-to-digital conversion applying such time buffering.

In a third possible implementation form of the method according to the third aspect as such or according to any of the preceding implementation forms of the third aspect, the time buffering comprises capacitive loading a pair of tri-state inverters.

Such capacitive loading can be easily and effectively implemented in hardware, e.g. by using an integrated circuit on a chip.

In a fourth possible implementation form of the method according to the third aspect as such or according to any of the preceding implementation forms of the third aspect, the time buffering comprises inverting or buffering an output of the tri-state inverters.

By inverting or buffering an output of the tri-state inverters, the result of the tri-state inverters can be efficiently buffered and the tri-state inverters are ready for the next processing step.

In a fifth possible implementation form of the method according to the third aspect as such or according to any of the preceding implementation forms of the third aspect, the time buffering comprises precharging the level signal if the input is low.

By using such precharging the level signal can be easily generated when the input signal is low.

In a sixth possible implementation form of the method according to the third aspect as such or according to any of the preceding implementation forms of the third aspect, the time buffering comprises holding the level signal if the input is high and the state signal is low.

Such a logic can easily be implemented.

In a seventh possible implementation form of the method according to the sixth implementation form of the third aspect, the method comprises discharging the level signal if the input signal is high and the state signal is high.

By using such discharging, different signal states of the level signal can be driven.

In an eighth possible implementation form of the method according to the sixth or the seventh implementation forms of the third aspect, the method comprises driving the state signal responsive to a hold signal and an awake signal.

By using such driving a hold signal and an awake signal can control the state of the time buffering, i.e. the time buffering can be easily controlled.

In a ninth possible implementation form of the method according to the eighth implementation form of the third aspect, the method further comprises driving the state signal responsive to a preset signal such that the state signal is high if the preset signal is high.

By using such driving a preset signal can be used to drive the state signal, hence providing an easy implementation of the time buffering.

In a tenth possible implementation form of the method according to the ninth implementation form of the third aspect, the method comprises driving the state signal such that the state signal toggles upon a rising edge of either the hold signal or the awake signal.

By using such driving the time buffering is sensitive with respect to rising signal edges, hence resulting in improved accuracy of the time buffering.

In an eleventh possible implementation form of the method according to any of the eighth to the tenth implementation forms of the first aspect, the awake signal is a sampling clock and the hold signal is a quantization error signal.

When the awake signal is a sampling clock and the hold signal is a quantization error signal, the hold signal of the time register can be applied in a feedback path of a time-to-digital conversion while the awake signal can be used to clock the time-to-digital conversion, hence providing a high precision time-to-digital conversion.

In a twelfth possible implementation form of the method according to the eleventh implementation form of the third aspect, each of the pair of outputs clocks is produced on the sampling clock, the output clock is a function of a time difference between a corresponding input clock and the quantization error signal.

Such a time buffering has the advantage that the output clock can accurately represent the time difference between the input clock and the quantization error signal and thus, the time buffering can be applied as a high-precision delaying in a time-to-digital conversion.

BRIEF DESCRIPTION OF THE DRAWINGS

Further embodiments of the invention will be described with respect to the following figures, in which.

DETAILED DESCRIPTION OF EMBODIMENTS

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
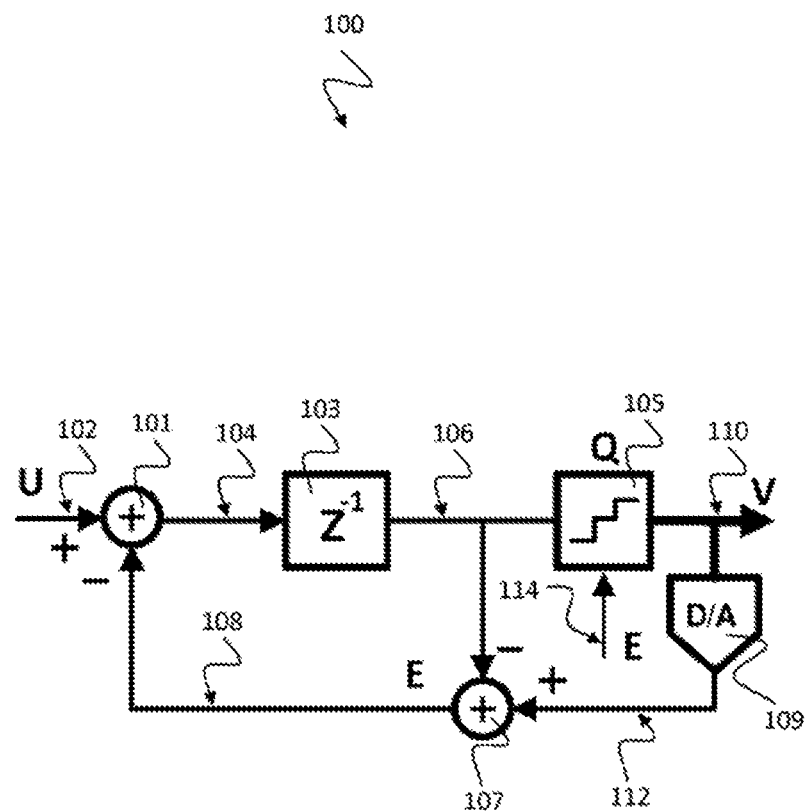
FIG. 1 shows a block diagram illustrating the general error-feedback structure 100 in the z-domain according to an implementation form.

FIG. 1 shows a block diagram illustrating the general error-feedback structure 100 in the z-domain according to an implementation form.

The error-feedback structure 100 includes a first adder 101, a delay unit 103, a quantizer 105, a digital-to-analog converter 109 and a second adder 107. The first adder 101 receives an input signal (U) at a first input 102 and a quantization error (E) at a first node 108 and is configured to subtract the error signal E from the input signal U to provide a first adder output signal 104 that is passed to the delay unit 103. The delay unit 103 delays the first adder output signal 104 by a unit delay to provide a delay unit output signal 106 that is passed to the quantizer 105 and the second adder 107. The quantizer 105 is configured to quantize the delay unit output signal 106 in steps determined by a control signal 114 to provide a digital output signal V at an output 110 of the error-feedback structure 100. The digital output signal V is passed to the digital-to-analog converter 109 to provide an analog output signal 112 that is passed to the second adder 107. The second adder 107 subtracts the delay unit output signal 106 from the analog output signal 112 to provide the quantization error (E) at the first node 118.

The error-feedback structure 100 can achieve the noise-shaping characteristics without using the integrator, which is the inevitable component in ΔΣ modulator. The z-domain model of the structure is shown in FIG. 1. Here, the quantization error E is obtained in analog form by subtracting the internal quantizer's 105 input 106 from the DAC 109 output 112. E is then fed back to the input (at first node 108) and the error between input signal U and E goes through the unit delay 103, $z^{-1}$, whose output 106 is connected to the quantizer 105. The output signal 110 in the z-domain is: $V=z^{-1}U+(1-z^{-1})$ E, where, V is the digital output and U is the analog input.

The input signal U is not only limited to be an electrical signal, but also can be a manner of temperature, mass and even time. Therefore, the time-domain error-feedback structure 100 can be implemented if the analog form of the z-domain is presented by time-interval as described below with respect to FIG. 2.

Figure 2:
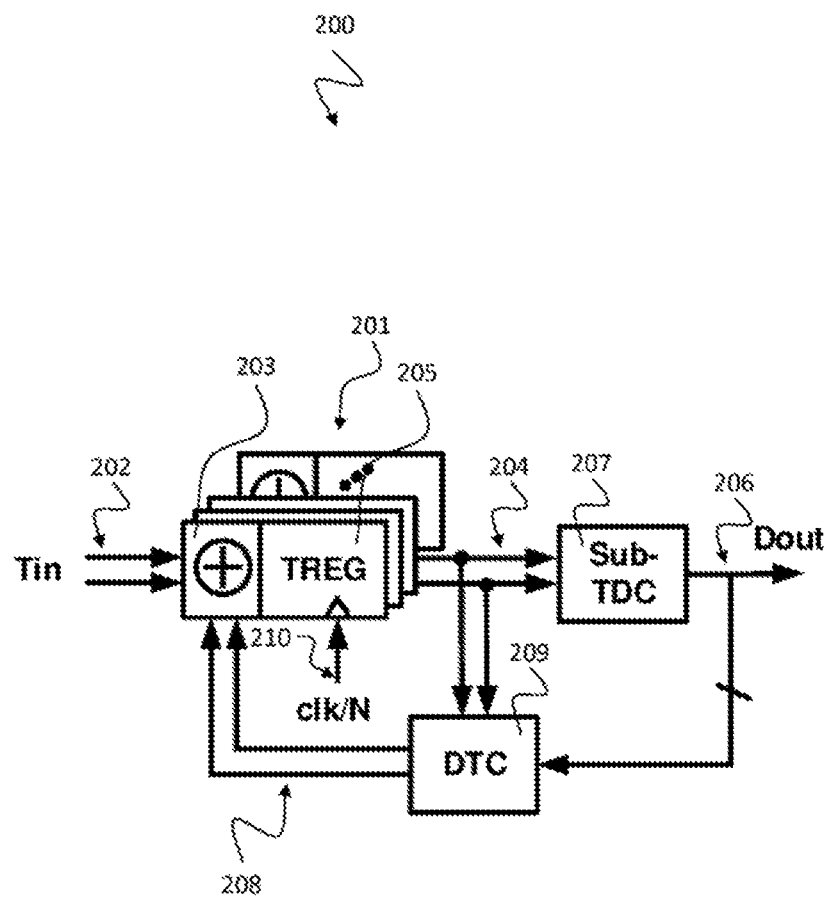
FIG. 2 shows a block diagram illustrating an error-feedback structure 200 in the time-domain according to an implementation form.

FIG. 2 shows a block diagram illustrating an error-feedback structure 200 with time-interleaved register in the z-domain according to an implementation form. The time-to-digital converter 200 includes an input 202 for receiving a time-domain input signal Tin; an output 206 for providing a digital output signal Dout; a time register 205 coupled to the input 202 and to a first node 208; a time quantizer 207 coupled to the time register 205 for providing the digital output signal Dout at the output 206; and a digital-to-time converter 209 coupled to the output 206 for providing a feed-back signal E at the first node 208. The time register 205 may be implemented as described below with respect to FIG. 3.

The digital output signal Dout is an oversampled representation of the time-domain input signal Tin. The feedback signal E is a quantization error signal $Q_{err}$. The digital-to-time converter 209 is coupled to the time register 205 for delaying an output signal 204 of the time register 205 in response to the digital output signal Dout. The time register 205 combines 203 the time-domain input signal Tin with the feedback signal E to produce a modified time-domain input signal. In FIG. 2, the combination 203 is a subtraction. The time register 205 delays the modified time-domain input signal by at least one cycle of a sampling clock. The time-domain input signal Tin may include a pair of two input signals that may include a first digital clock and a second digital clock. A value of the time-domain input signal Tin may correspond to a time difference between a transition of the first digital clock and a transition of the second digital clock.

The error-feedback structure 200 corresponds to the error-feedback structure 100 described above with respect to FIG. 1. However, the unit delay $z^{-1}$ 103 and the first adder 101 that performs a subtraction operation are replaced by a time-domain register 205 combined with subtractor 203. The voltage quantizer 105 or internal ADC of the error-feedback structure 100 described above with respect to FIG. 1 is replaced by a sub-TDC 207, whose input is the time-difference 204 or time interval instead of the voltage. Similarly, digital-to-time converter (DTC) 209 is used here to convert the digital code to time-interval, which is fed back to the input or first node 208 respectively.

The time-domain register 205 combined with subtractor 203 may be implemented as a plurality of subtractor-register devices 201 that may operate in parallel, e.g. by performing a pipeline processing. Such a parallel processing reduces the processing burden on the time-domain register 205. Instead of a single processing task multiple processing tasks can be performed by the multiple subtractor-register devices 201 in the same time instant.

The quantization noise is pushed to the high frequency due to the noise-shaping characteristic thus making the TDC's 200 resolution depend on the device noise, such as flicker/thermal noise instead of quantization noise. Therefore, the resolution of the TDC 200 is highly improved and independent from the process of technology. For example, in 40 nm CMOS process the minimal delay of inverter is about 10 ps.

Figure 3:
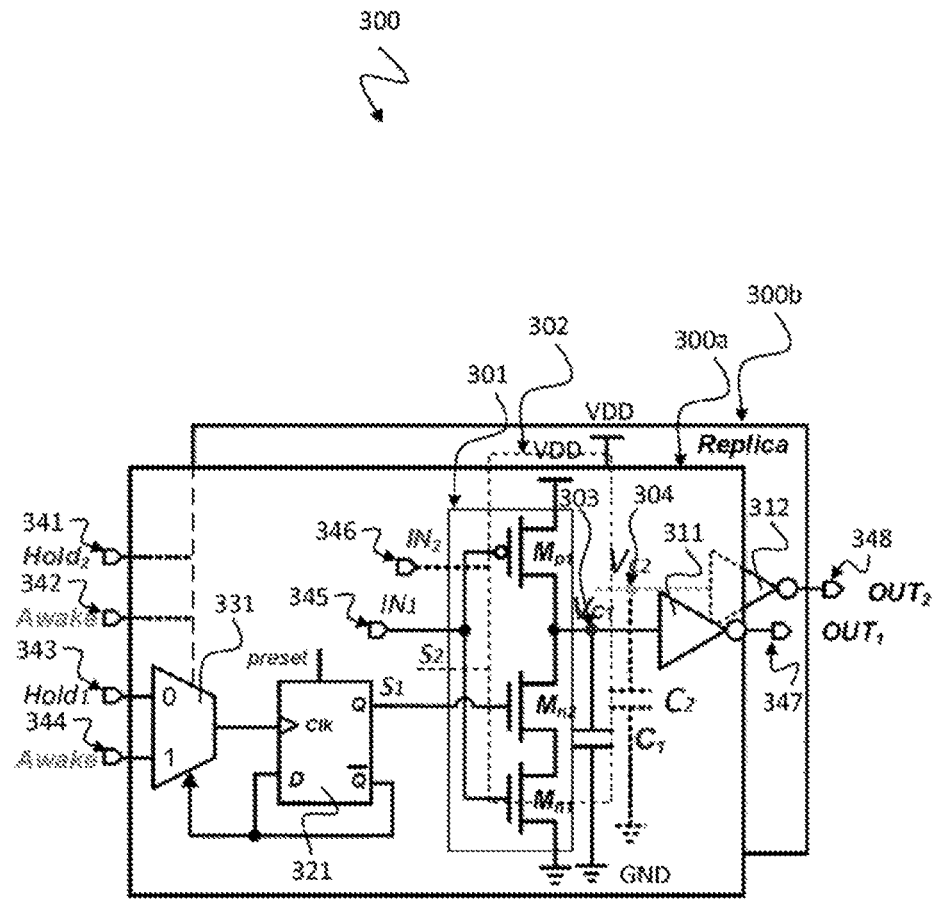
FIG. 3 shows a schematic diagram illustrating a time register 300 according to an implementation form.

FIG. 3 shows a schematic diagram illustrating a time register 300 according to an implementation form. The time register 300 includes a pair of inputs 345, 346 coupled to a pair of input clocks $IN_1$, $IN_2$; a pair of tri-state inverters 301, 302 for producing a pair of level signals $V_{C1}$, $V_{C2}$; and a pair of outputs 347, 348 coupled to the level signals $V_{C1}$, $V_{C2}$ for producing a pair of output clocks $OUT_1$, $OUT_2$. The tri-state inverters 301, 302 are responsive to a pair of state signals $S_1$, $S_2$ and the pair of input clocks $IN_1$, $IN_2$ for holding or discharging the level signals $V_{C1}$, $V_{C2}$. A first circuit 300a and a second circuit 300b that is a replica of the first circuit 300a are used to provide the respective signal rails of the signal pairs. Instead of the tri-state inverters 301, 302 any other tri-state logic circuit that performs a tri-state or three-state logic may be used.

The tri-state inverters 301, 302 are responsive to the state signals $S_1$, $S_2$ and the input clocks $IN_1$, $IN_2$ for propagating a time difference of a pair of time differences $T_1$, $T_2$ between the respective input clock $IN_1$, $IN_2$ and the respective state signal $S_1$, $S_2$ to a voltage difference between the level signals $V_{C1}$, $V_{C2}$ as described below with respect to FIG. 4.

The voltage difference between the level signals $V_{C1}$, $V_{C2}$ may be proportional to the time difference of the pair of time differences T1, T2. The time register 300 further includes a pair of capacitances $C_1$, $C_2$ for capacitive loading the tri-state inverters 301, 302. The capacitances $C_1$, $C_2$ may include parasitic capacitances coupled between the first node 303, 304 and ground GND. The time register 300 may include inverters 311, 312 or buffers connected to the tri-state inverters 301, 302. The time register 300 may include a charging source VDD for precharging the level signal $V_{C1}$, $V_{C2}$ if the input 345, 346 is low. The time register 300 may include a logic circuitry 321, 331 for holding the level signal $V_{C1}$, $V_{C2}$ if the input 345, 346 is high and the state signal $S_1$, $S_2$ is low.

The logic circuitry of FIG. 3 includes a flip-flop 321, e.g. a D flip-flop, and a multiplexer 331 driving the clock input of the flip-flop 321 (depicted in FIG. 3 for the first circuit 300a, however the same logic circuitry exists for the second circuit 300b). The multiplexer 331 switches the Hold signal at port 343 or the Awake signal at port 344 to the clock input of the flip-flop 321. The multiplexer 331 is controlled by the D input of the flip-flop 321 that is equal to the inverting Q output of the flip-flop 321. The non-inverting Q output of the flip-flop 321 produces the first state signal $S_1$. The second state signal $S_2$ is produced by a logic circuitry of the second circuit 300b that is not depicted in FIG. 3.

The logic circuitry 321, 331 operates to discharge the level signal $V_{C1}$, $V_{C2}$ if the input 345, 346 is high and the state signal $S_1$, $S_2$ is high. The logic circuitry 321, 331 operates to drive the state signal $S_1$, $S_2$ responsive to a hold signal $Hold_1$, $Hold_2$ and an awake signal (Awake). The logic circuitry 321, 331 operates to drive the state signal $S_1$, $S_2$ responsive to a preset signal (preset) such that the state signal $S_1$, $S_2$ is high if the preset signal (preset) is high. The logic circuitry 321, 331 operates to drive the state signal $S_1$, $S_2$ such that the state signal $S_1$, $S_2$ toggles upon a rising edge of either the hold signal ($Hold_1$, $Hold_2$) or the awake signal (Awake). The awake signal (Awake) may be a sampling clock and the hold signal $Hold_1$, $Hold_2$ may be a quantization error signal.

Each of the pair of outputs 347, 348 is produced on the sampling clock. The output clock $OUT_1$, $OUT_2$ is a function of a time difference between a corresponding input clock $IN_1$, $IN_2$ and the quantization error signal.

In the exemplary implementation of FIG. 3, the tri-state inverters 301, 302 are realized by PMOS and NMOS transistors as described in the following. Such an implementation provides a time register 300 including a first circuit 300a and a second circuit 300b, each of the circuits 300a, 300b including a tri-state inverter 301, 302 coupled between a capacitive loaded first node 303, 304 and an output node 347, 348. The tri-state inverter 301, 302 includes a PMOS transistor $M_{p1}$ coupled between a battery voltage VDD and the first node 303, 304; a first NMOS transistor $M_{n1}$ and a second NMOS transistor $M_{n2}$ coupled in series between the first node 303, 304 and a reference voltage GND. A control terminal of the PMOS transistor $M_{p1}$ and a control terminal of the first NMOS transistor $M_{n1}$ are driven by an input signal $IN_1$, $IN_2$ and a control terminal of the second NMOS transistor $M_{n2}$ is driven by a state signal $S_1$, $S_2$. The tri-state inverter 301, 302 propagates a time difference $T_1$, $T_2$ between the input signal $IN_1$, $IN_2$ and the state signal $S_1$, $S_2$ to a voltage level $V_{C1}$, $V_{C2}$ at the first node 303, 304 as described below with respect to FIG. 4.

The tri-state inverters 301, 302 of the first circuit 300a and the second circuit 300b are responsive to the state signals $S_1$, $S_2$ and the input signals $IN_1$, $IN_2$ for propagating a difference of the time difference $T_1$ of the first circuit 300a and the time difference $T_2$ of the second circuit 300b to a difference of the voltage levels $V_{C1}$, $V_{C2}$ at the first node 303, 304 of the first circuit 300a and the second circuit 300b as described below with respect to FIG. 4.

The time register 300 may be used as one of the time-domain registers 205 in a time-to-digital converter 200 as described above with respect to FIG. 2.

Figure 4:
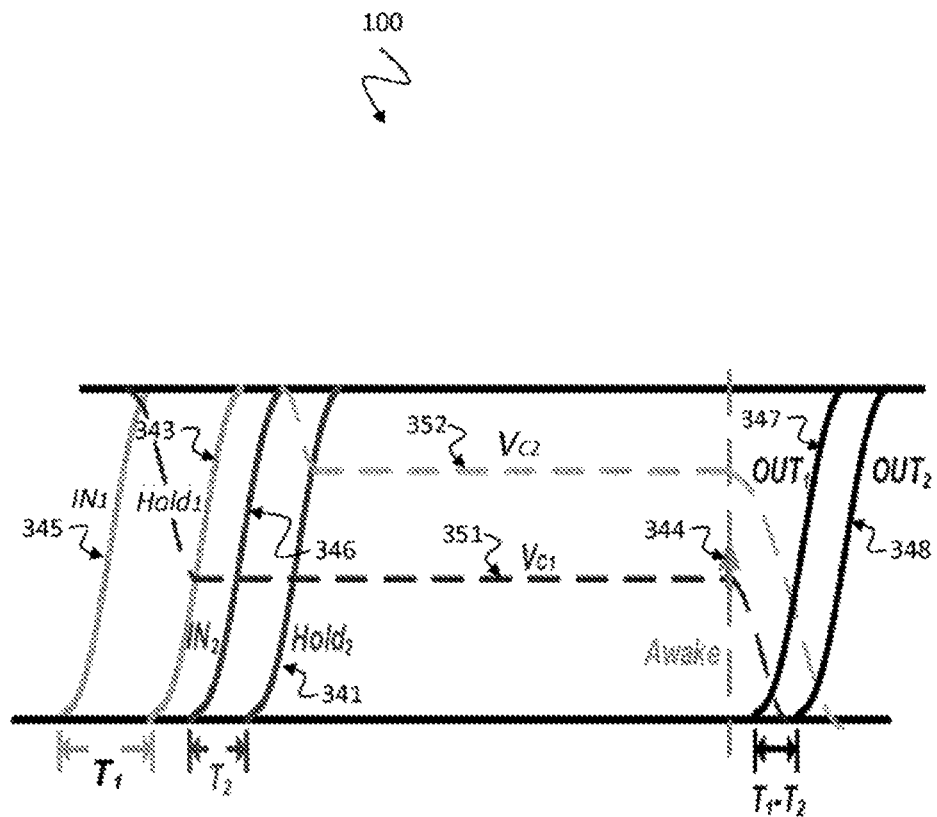
FIG. 4 shows a simplified schematic diagram illustrating the waveforms of signals used in the time register 300 depicted in FIG. 3.

FIG. 4 shows a simplified schematic diagram illustrating the waveforms of signals used in the time register 300 depicted in FIG. 3.

The operation of the time registers with the implicit adder/subtractor is explained with waveforms in FIG. 4. There are four major phases: pre-charge, discharge, hold mode and residual discharge. When the inputs $IN_1$ and $IN_2$ are initially low, the load capacitors $C_1$ and $C_2$ are pre-charged to VDD by the PMOS transistors $M_{P1}$. Due to the initial assertion of the preset signal, the Q output of the flip-flop 321 (corresponding to the state signal $S_1$, $S_2$) is initialized to high. After the rising edges are applied to $IN_1$ and $IN_2$, $C_1$ and $C_2$ start to discharge through $M_{n1}$ and $M_{n2}$ until the rising edges are later applied to $Hold_1$ and $Hold_2$, which set the flip-flop 321 Q output to low.

The voltages $V_{C1}$ and $V_{C2}$ are held steady until a trigger edge Awake resumes their discharges. Then, the rising edges of $IN_1$ and $IN_2$ are eventually propagated to the outputs $OUT_1$ and $OUT_2$. In other words, the time difference of $T_1$ and $T_2$ is proportional to the voltage difference of $V_{C1}$ and $V_{C2}$, thus the time-domain subtraction (or addition if inputs are swapped) can be realized during the process of residual discharge, which converts the voltage-difference back to the corresponding time interval. The propagation delay of input-output depends on the duration time of hold mode whose period is equal to 1/Fs and thus, presents a unit delay $z^{-1}$ in the z-domain model. A short discharge time is preferred for the immunity of time perturbations associated with the in-band noise of the TDC. Besides, the usage of the single-phase gated inverter (driving $C_1/C_2$) eliminates the switching mismatches caused by PMOS and NMOS. As a result, the linearity is greatly improved.

Figure 5:
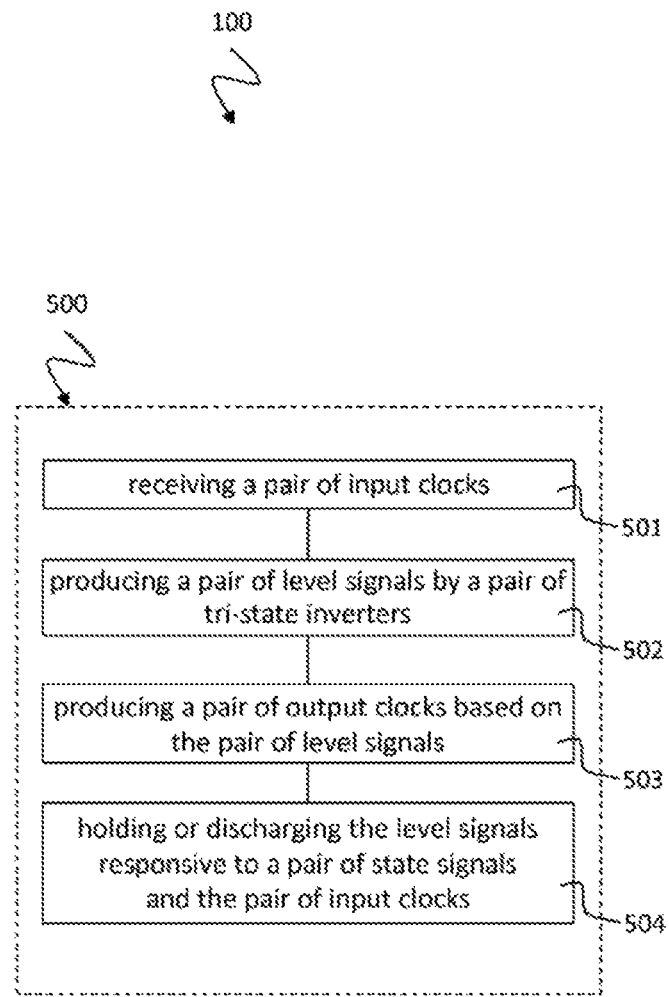
FIG. 5 shows a schematic diagram illustrating a method 500 for time buffering according to an implementation form.

FIG. 5 shows a schematic diagram illustrating a method 500 for time buffering according to an implementation form. The method 500 includes receiving 501 a pair of input clocks; producing 502 a pair of level signals by a pair of tri-state inverters; producing 503 a pair of output clocks based on the pair of level signals; and holding or discharging 504 the level signals responsive to a pair of state signals and the pair of input clocks.

The pair of level signals may be produced responsive to the state signals and the inputs clocks for propagating a time difference of a pair of time differences between the respective input clock and the respective state signal to a voltage difference between the level signals. The voltage difference between the level signals may be proportional to the time difference of the pair of time differences. The time buffering may include capacitive loading a pair of tri-state inverters. The time buffering may include inverting or buffering an output of the tri-state inverters. The time buffering may include precharging the level signal if the input is low. The time buffering may include holding the level signal if the input is high and the state signal is low. The method 500 may include discharging the level signal if the input signal is high and the state signal is high. The method 500 may include driving the state signal responsive to a hold signal and an awake signal. The method 500 may include driving the state signal responsive to a preset signal such that the state signal is high if the preset signal is high. The method 500 may include driving the state signal such that the state signal toggles upon a rising edge of either the hold signal or the awake signal. The awake signal may be a sampling clock and the hold signal may be a quantization error signal. Each of the pair of outputs clocks may be produced on the sampling clock, the output clock may be a function of a time difference between a corresponding input clock and the quantization error signal.

The method 500 may implement the same functionality as the time register 300 described above with respect to FIG. 3.

Time registers as presented above can be used in TDCs which may be implemented in PLLs. When such a time register based TDC is used in a PLL, the noise shaping in spectrum may effect a widening of the bandwidth of the PLL.

The present disclosure also supports a computer program product including computer executable code or computer executable instructions that, when executed, causes at least one computer to execute the performing and computing steps described herein, in particular the method 500 as described above with respect to FIG. 5 and the techniques described above with respect to FIGS. 1 to 4. Such a computer program product may include a readable storage medium storing program code thereon for use by a computer. The program code may perform the method 500 as described above with respect to FIG. 5.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A time register comprising:
   a pair of inputs coupled to a pair of input clocks;
   a pair of tri-state inverters for producing a pair of level signals; and
   a pair of outputs coupled to the level signals for producing a pair of output clocks,
   wherein the tri-state inverters are responsive to a pair of state signals and the pair of input clocks for holding or discharging the level signals, and
   wherein the time register further comprises a pair of capacitors for capacitive loading the tri-state inverters.

2. The time register of claim 1,
   wherein the tri-state inverters are responsive to the state signals and the input clocks for propagating a time difference of a pair of time differences between the respective input clock and the respective state signal to a voltage difference between the level signals.

3. The time register of claim 2,
   wherein the voltage difference between the level signals is proportional to the time difference of the pair of time differences.

4. The time register of claim 1, comprising inverters or buffers connected to the tri-state inverters.

5. The time register of claim 1, comprising a charging source for precharging the level signal if the input is low.

6. The time register of claim 1, comprising a logic circuitry for holding the level signal if the input is high and the state signal is low.

7. The time register of claim 6, wherein the logic circuitry is configured to discharge the level signal if the input is high and the state signal is high.

8. The time register of claim 6, wherein the logic circuitry is configured to drive the state signal responsive to a hold signal and an awake signal.

9. The time register of claim 8, wherein the logic circuitry is further configured to drive the state signal responsive to a preset signal such that the state signal is high if the preset signal is high.

10. The time register of claim 9, wherein the logic circuitry is configured to drive the state signal such that the state signal toggles upon a rising edge of either the hold signal or the awake signal.

11. The time register of claim 8, wherein the awake signal is a sampling clock and wherein the hold signal is a quantization error signal.

12. The time register of claim 11, wherein each of the pair of outputs is produced on the sampling clock, the output clock is a function of a time difference between a corresponding input clock and the quantization error signal.

13. A time register comprising a first circuit and a second circuit, each of the first circuit and the second circuit comprising:
   a tri-state inverter coupled between a capacitive loaded first node and an output node, the tri-state inverter comprising:
   a PMOS transistor coupled between a battery voltage and the first node; and a first NMOS transistor and a second NMOS transistor coupled in series between the first node and a reference voltage, wherein a control terminal of the PMOS transistor and a control terminal of the first NMOS transistor are driven by an input signal and a control terminal of the second NMOS transistor is driven by a state signal, and wherein the tri-state inverter is configured to propagate a time difference between the input signal and the state signal to a voltage level at the first node.

14. The time register of claim 13, wherein the tri-state inverters of the first circuit and the second circuit are responsive to the state signals and the input signals for propagating a difference of the time difference of the first circuit and the time difference of the second circuit to a difference of the voltage levels at the first node of the first circuit and the second circuit.

* * * * *